United States Patent [19]

Wilson

[11] Patent Number: 4,798,812

[45] Date of Patent: Jan. 17, 1989

[54] METHOD FOR LIQUID PHASE EPITAXIAL GROWTH

[75] Inventor: Randall B. Wilson, Maplewood, N.J.

[73] Assignee: Lytel Corporation, Sommerville, N.J.

[21] Appl. No.: 83,649

[22] Filed: Aug. 7, 1987

[51] Int. Cl.⁴ .......................................... H01L 21/208
[52] U.S. Cl. ................................... 437/119; 118/415;
437/120; 437/130; 437/133
[58] Field of Search ............... 437/119, 120, 130, 133;
118/415

[56] References Cited

U.S. PATENT DOCUMENTS 3,565,702  2/1971  Nelson ................................ 437/119
3,933,538  1/1976  Akai et al. .......................... 437/120
4,661,175  4/1987  Kuphal et al. ...................... 437/119

OTHER PUBLICATIONS

H. Nagai et al, "Thermal Deformation of Surface Corrugations on InGaAsP Crystals", *Journal of Crystal Growth*, vol. 71, pp. 225–231, 1985.

Yu. P. Khukhryanskii et al., "Pressure of the Vapor Phase Above Solutions of InP and InAsihTin", Izv. Akad. Nauk SSSR, Neorg–Mater, vol. 13, No. 5, May 1977, pp. 785–788.

Logan et al., *J. of Crystal Growth*, vol. 76, Jul. 1986, pp. 17–30, North Holland, Amsterdam.

*Primary Examiner*—George T. Ozaki
*Attorney, Agent, or Firm*—Stanger, Michaelson, Reynolds, Spivak & Tobia

[57] ABSTRACT

A method of fabricating a solid state device having chemically bound arsenic and phosphorous includes carrying out liquid phase epitaxial growth in the presence of partial pressures of arsenic and phosphorus.

10 Claims, 2 Drawing Sheets

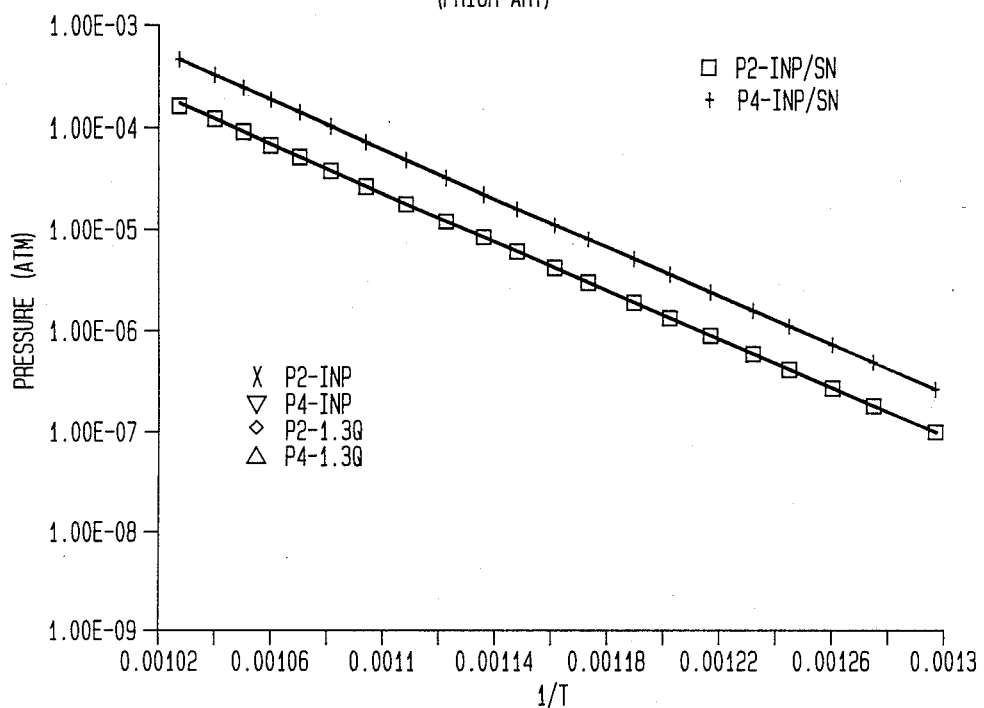
FIG. 1 (PRIOR ART) TIN SOLUTIONS OF INP
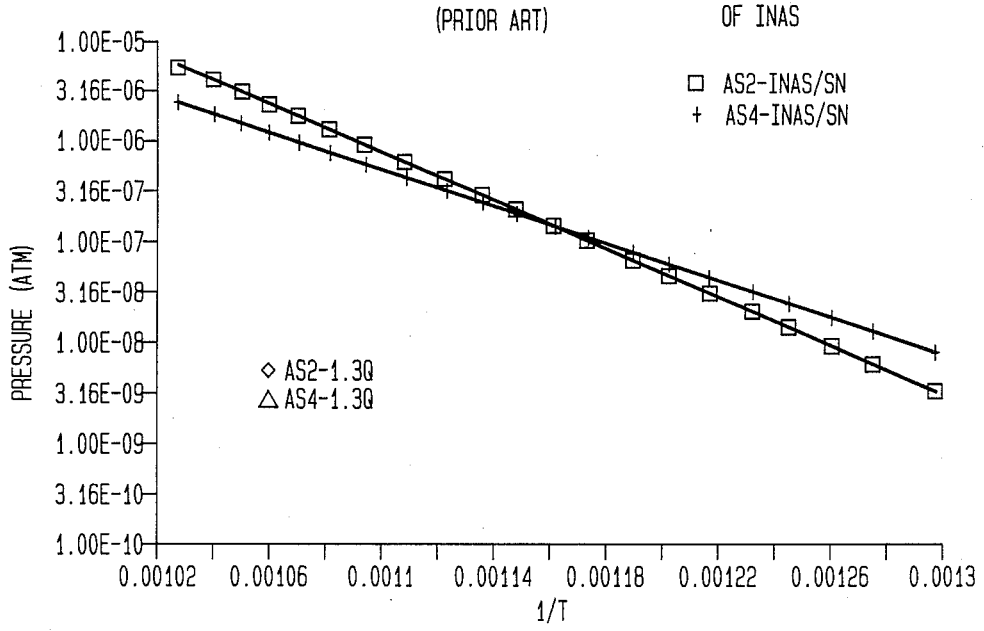
FIG. 2 (PRIOR ART) TIN SOLUTIONS OF INAS

METHOD FOR LIQUID PHASE EPITAXIAL GROWTH

FIELD OF THE INVENTION

The invention relates to a method and apparatus for liquid phase epitaxial growth and particularly, to liquid phase epitaxial growth during the fabrication of a solid state device having chemically bound arsenic and phosphorus. The invention minimizes the number of defects which can arise due to the loss of As and P atoms during liquid phase epitaxial growth. Such defects can adversely affect the performance of the solid state device.

BACKGROUND OF THE INVENTION

Liquid phase epitaxial growth is a common step carried out during the fabrication of many different types of solid state devices. As used herein, "liquid phase epitaxial growth" includes both growth and regrowth. The prior art has recognized that defects in a solid state device can arise when liquid phase epitaxial growth is used for fabricating a solid state device having chemically bound phosphorus.

Generally, liquid phase epitaxial growth is carried out by initially heating a wafer or substrate, thereafter, allowing epitaxial growth, and subsequently, cooling the wafer or substrate. Loss of P and/or As atoms can occur during the initial heating and cooling steps.

The article entitled, "Prevention of InP Surface Decomposition in Liquid Phase Epitaxial Growth" by G. A. Antypas, Appl. Phys. Lett. 37 (1), July 1980, pp. 64-65, discloses that loss of P atoms during liquid phase epitaxial growth can produce defects. The article discloses that the loss of P atoms can be inhibited by carrying out the initial heating step prior to the liquid phase epitaxial growth in the presence of a partial pressure of phosphorus which is greater than the decomposition pressure of phosphorus of InP. The partial pressure of phosphorus was obtained using InP dissolved in tin, i.e. an InP-Sn solution. The article discloses that the InP-Sn solution was in a graphite cup having a plurality of holes and loaded in a conventional liquid phase epitaxial boat directly over the InP substrate being treated.

The article entitled, "Thermal Deformation of Surface Corrugations on InGaAsP Crystals" by H. Nagai, Y. Noguchi and T. Matsuoka, J. of Crystal Growth, Vol. 71, 1985, pp. 225-231, discloses a study of thermal deformations which arise during liquid phase epitaxial growth. The article is particularly directed to the loss of P atoms in distributed feedback laser diodes. The article states that providing an atmosphere of $PH_3$ during the liquid phase epitaxial growth of a device having a layer of InP can be used to inhibit defects in this layer. The article reports that the $PH_3$ was also effective in preventing defects in an InGaAsP surface during liquid phase epitaxial growth. The article recognizes that with the temperatures used in liquid phase epitaxial growth it is likely that a preferential vaporization of both As and P can occur. The primary solution to this problem reported in the article is the use of an atmosphere of $PH_3$.

The article entitled, "Enhanced Indium Phosphide Substrate Protection for Liquid Phase Epitaxy Growth of Indium-Gallium-Arsenide-Phosphide Double Heterostructure Lasers", by P. Besomi, R. B. Wilson, W. R. Wagner, and R. J. Nelson, J. Appl. Phys., Vol. 54 (2) February 1983, pp. 535-539, discloses a method and apparatus using an InP-Sn solution within a conventional chamber during liquid phase epitaxial growth to inhibit thermal damage in an InP substrate. The article does not address thermal damage due to the loss of As atoms because only the InP layer was studied.

As used herein, the terms "chemically bound phosphorus" and "chemically bound arsenic" refer to compositions in which phosphorus and arsenic atoms, respectively, are chemically bound such as InP, InGaAsP and the like. Typically, an InP layer and an InGaAsP layer are present in laser diodes.

The loss of As and P atoms during liquid phase epitaxial growth is more likely to occur if a layer containing one of these atoms is exposed. This is the case for a solid state device such as a laser device which is formed by a fabrication process including the steps of etching layers and thereafter carrying out a liquid phase epitaxial regrowth. An exposed active layer (InGaAsP) can lose both As and P atoms.

SUMMARY OF THE INVENTION

The invention relates to a method and apparatus for liquid phase epitaxial growth for fabricating a solid state device having chemically bound arsenic and phosphorus. Typically, a solid state laser diode includes a layer of InGaAsP. The liquid phase epitaxial growth according to the invention is carried out while producing partial pressures of phosphorus and arsenic from separate sources. These partial pressures are maintained particularly during the heating and/or cooling steps.

The partial pressure of the phosphorus is maintained higher than the decomposition pressure of the chemically bound phosphorus and the partial pressure of the arsenic is maintained greater than the decomposition pressure of the chemically bound arsenic. Under such circumstances, the migration and loss of chemically bound atoms of phosphorus and arsenic are inhibited. Such a loss of atoms is more likely to occur for portions of an exposed layer. Thus, defects which would otherwise arise are avoided or at least minimized.

The partial pressures of phosphorus and arsenic can be achieved using known solutions. For example, an InAs-Sn solution can be used to produce the arsenic partial pressure while an InP-Sn solution can be used to produce the phosphorus partial pressure. Other sources for achieving the partial pressures of phosphorus and arsenic can be used and are known in the prior art. The sources for the partial pressures of phosphorus and arsenic are preferably distinct from each other.

The apparatus for carrying out the liquid phase epitaxial growth according to the invention is a modified conventional apparatus which includes a chamber. The chamber is suitable for operating in the temperature range for liquid phase epitaxial growth and is generally non-reactive with the ambient gas, or wafer or substrate at the temperatures being used. Generally, a temperature range of 620° C. to 690° C. is used for a period of from about 2 to about 3 hours for the growth. It is known in the art to use a chamber made from graphite for this type of apparatus.

The apparatus is adapted to receive separate sources for producing the phosphorus and arsenic partial pressures. Typically, solutions to provide the arsenic and phosphorus partial pressures are contained in separate troughs in a graphite container positioned in the chamber. The chamber preferably includes a top portion which may be removable and a bottom portion adapted to receive a wafer or substrate or the like to be subjected to liquid phase, epitaxial growth.

BRIEF DESCRIPTION OF THE DRAWINGS

FIG. 1 is a graph of partial pressure versus 1/T for a tin solution of InP;

FIG. 2 is a graph of partial pressure versus 1/T for a tin solution of InAs.

DESCRIPTION OF THE INVENTION

Figure 3:
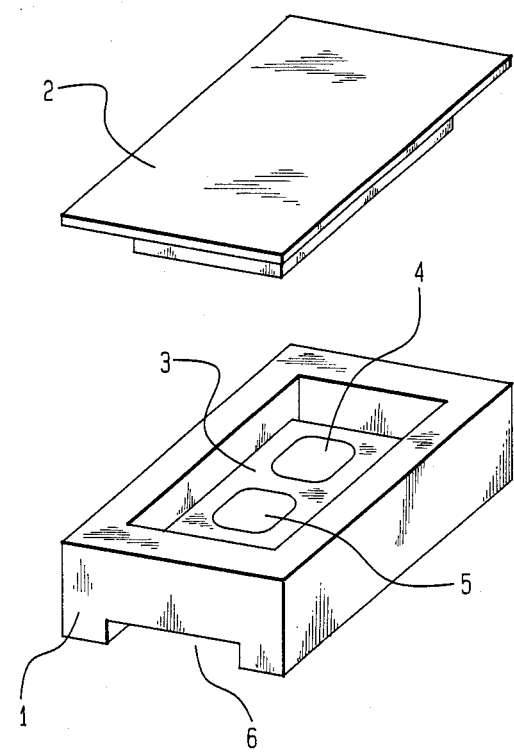
FIG. 3 is a front perspective view of a chamber and trough according to the invention and forming a part of a modified conventional apparatus.

It is well known that a liquid phase epitaxial growth during the fabrication of solid state devices such as double channel planar buried heterostructure (DCPBH) laser devices is often important for producing reliable devices. Studies in the prior art have led to the use of a phosphorus partial pressure greater than the phosphorus decomposition pressure within the chamber used for liquid phase epitaxial growth for the fabrication of devices having chemically bound phosphorus.

In a solid state device such as the DCPBH laser device, an etched wafer subjected to liquid phase epitaxial regrowth contains exposed portions of an InGaAsP active layer. The applicant reasoned that the exposed portions of the InGaAsP can develop defects due to the loss of arsenic atoms as in the case of defects due to the loss of phosphorus atoms. The applicant has made a study of exposed active layers which have been subjected to iquid phase epitaxial regrowth and discovered that defects in fact do arise due to the loss of As atoms.

Experiments were conducted by the applicant using the conventional method of providing a partial pressure of phosphorus greater than the phosphorus decomposition pressure. The partial pressure of phosphorus was effective in minimizing defects in exposed portions of an InP layer but relatively ineffective with respect to portions of exposed active layers due to the loss of As atoms. This appears to be in contrast to the aforementioned article by H. Nagai et al., wherein it was reported that an atmosphere of $PH_3$ minimized thermal deformations in an InGaAsP composition.

Additional experiments were carried out by the applicant. InAs was added to the InP-Sn solution to produce partial pressures of both phosphorus and arsenic within the chamber during the liquid phase epitaxial growth. Surprisingly, no significant reduction in defects arising from the loss of chemically bound arsenic was observed. On the contrary, greater losses of P atoms occurred and a greater number of defects were observed. It was reasoned that the added arsenic lowered the partial pressure of the phosphorus.

Thereafter, experiments were carried out by the applicant using an InP-Sn solution and an InAs-Sn solution to supply the partial pressures of phosphorus and arsenic. That is, separate sources for producing the partial pressures of phosphorus and arsenic.

Excellent results were obtained when separate sources were used. Far fewer defects were observed as compared to using a single source for P or a combined source for P and As. One source had 300 mg of InP in 1200 mg of Sn. The other source had 200 mg of InAs in 200 mg of Sn. A temperature of from about 620° C. to about 69° C. was used for about 2-3 hours The establishment of suitable partial pressures can be determined by routine experimentation. Prior art data relating to partial pressures of arsenic and phosphorus can be used to provide guidelines for carrying out experiments.

The article entitled, "Pressure of the Vapor Phase Above Solutions of InP and InAs in Tin" by Yu. P. Khukhryanskii and V. I. Panteleev, Izv. Akad. Nauk SSSR Neorg. Mater, Vol. 13, No. 5, pp. 785-788, May, 1977 shows the relationship between partial pressures for phosphorus ($P_2$ and $P_4$) and arsenic ($As_2$ and $As_4$) versus the reciprocal of temperature. FIGS. 1 and 2 herein are based on this article. The temperature "T" is in Degrees Kelvin so that a temperature of 600° C. is equivalent to a 1/T of about 0.001145. The pressure is in atmospheres.

FIG. 1 is for a tin solution of InP. The partial pressure produced from this solution can be related to $P_2$ and $P_4$ separately. Similarly, FIG. 2 is for a tin solution of InAs and the partial pressure produced from the solution can be related to $As_2$ and $As_4$ separately.

During the course of experiments, the applicant found that the InAs-Sn solution gained weight while the InP-Sn lost weight. This indicates that phosphorus was dissolving in the InAs-Sn solution. It is expected that a higher phosphorus partial pressure would be obtained if the InAs-Sn solution were not there. Table shows the weigh changes for the tin solutions of InP and InAs.

TABLE

| Example | InP—Sn Before | InP—Sn After | InAs—Sn Before | InAs—Sn Before | InP—Sn Change | InAs—Sn Change |
|---|---|---|---|---|---|---|
| 1 | 760.691 | 748.2 | 806.854 | 821.5 | −12.49 | +4.64 |
| 2 | 765.031 | 754.0 | 813.849 | 817.0 | −11.03 | +3.16 |
| 3 | 758.468 | 748.2 | 809.077 | 811.5 | −10.27 | +2.42 |

The table shows that the weight changes in the tin solutions of InAs and InP and that the overall weight loss in the chamber is less than obtained for a tin solution of InP alone. This indicates that the phosphorus partial pressure is being adversely influenced by the tin solution of InAs.

It is believed that this adverse condition can be avoided or diminished several ways. A large tin solution of InP can be used with a relatively small tin solution of InAs. Alternatively, a source for the phosphorus partial pressure can be used to provide greater $P_2$ and $P_4$ partial pressures than obtained from the tin solution of InP. One possibility for this is to replace the tin solution with bismuth or lead or a mixture of tin with bismuth or lead. It has been reported in an article by E. Buehler and K. J. Bachmann in the J. Cryst. Growth, Vol. 35 (60), 1977 that the use of bismuth or lead as a solvent instead of tin can result in relatively large partial vapor pressures even for a dilute solution of InP.

FIG. 3 shows a chamber 1 made of graphite and suitable for use in a conventional apparatus for carrying out liquid phase epitaxial growth and regrowth. A lid 2 made of graphite is used as a lid for the chamber 1. A graphite piece 3 within the chamber 1 has troughs 4 and 5 suitable for receiving separate tin solutions. For example, trough 4 can be used as a source to produce a phosphorus partial pressure by including a InP-Sn solution. Similarly, the trough 5 can contain an InAs-Sn solution to produce an arsenic partial pressure. Cutout portion 6 receives a conventional slider holding a wafer or substrate.

Finally, the above described embodiments of the invention are intended to be illustrative only. Numerous alternative embodiments may be devised by those skilled in the art without departing from the spirit and scope of the following claims.

I claim:

1. A method of fabricating a solid state electronic device which includes a layer comprising chemically bound phosphorus and arsenic, said method including the step of exposing said device to a temperature and for a time to produce liquid phase epitaxial growth, said step being carried out in the presence of first and second melts of phosphorus and arsenic in a manner to provide a partial pressure of phosphorus and arsenic respectively to reduce the loss of phosphorus and arsenic from said layer during said step.

2. The method of claim 1, wherein the partial pressure of arsenic is greater than the decomposition pressure of arsenic and the partial pressure of phosphorus is greater than the decomposition pressure of phosphorus.

3. The method of claim 1, wherein said liquid phase epitaxial growth comprises an initial heating step and said partial pressures are maintained during said heating step.

4. The method of claim 1, wherein said liquid phase epitaxial growth comrises a cooling step and said partial pressures are maintained during said cooling step.

5. The method of claim 1, wherein the partial pressure of arsenic is produced from an InAs-Sn solution.

6. The method of claim 1, wherein the partial pressure of phosphorus is produced from an InP-Sn solution.

7. The method of claim 1, wherein said liquid phase epitaxial growth is a regrowth step.

8. The method of claim 1, wherein said solid state device is a laser device.

9. The method of claim 1, wherein the phosphorus partial pressure is produced from a solution of bismuth or lead.

10. A method of claim 1 for fabricating a solid state device having chemically bound arsenic and phosphorus, comprising carrying out liquid phase epitaxial growth in the presence of partial pressures of arsenic and phosphorus at a temperature of from about 620° C. to about 690° C.

* * * * *